US010553728B2

(12) United States Patent
Matsumoto et al.

(10) Patent No.: US 10,553,728 B2
(45) Date of Patent: Feb. 4, 2020

(54) METHOD FOR PRODUCING FIELD-EFFECT TRANSISTOR

(71) Applicants: Shinji Matsumoto, Kanagawa (JP); Naoyuki Ueda, Kanagawa (JP); Yuki Nakamura, Tokyo (JP); Yukiko Abe, Kanagawa (JP); Yuji Sone, Kanagawa (JP); Ryoichi Saotome, Kanagawa (JP); Sadanori Arae, Kanagawa (JP); Minehide Kusayanagi, Kanagawa (JP)

(72) Inventors: Shinji Matsumoto, Kanagawa (JP); Naoyuki Ueda, Kanagawa (JP); Yuki Nakamura, Tokyo (JP); Yukiko Abe, Kanagawa (JP); Yuji Sone, Kanagawa (JP); Ryoichi Saotome, Kanagawa (JP); Sadanori Arae, Kanagawa (JP); Minehide Kusayanagi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/131,760

(22) Filed: Sep. 14, 2018

(65) Prior Publication Data
US 2019/0027608 A1 Jan. 24, 2019

Related U.S. Application Data

(63) Continuation of application No. PCT/JP2017/010279, filed on Mar. 14, 2017.

(30) Foreign Application Priority Data

Mar. 18, 2016 (JP) .................................. 2016-055630
Mar. 1, 2017 (JP) .................................. 2017-038178

(51) Int. Cl.
| H01L 21/00 | (2006.01) |
| H01L 21/16 | (2006.01) |
| H01L 29/786 | (2006.01) |
| H01L 21/02 | (2006.01) |
| H01L 27/12 | (2006.01) |
| H01L 29/04 | (2006.01) |
| H01L 29/24 | (2006.01) |
| H01L 51/00 | (2006.01) |

(52) U.S. Cl.
CPC .... *H01L 29/7869* (2013.01); *H01L 21/02565* (2013.01); *H01L 27/1225* (2013.01); *H01L 27/1229* (2013.01); *H01L 29/04* (2013.01); *H01L 29/24* (2013.01); *H01L 29/78606* (2013.01); *H01L 51/0008* (2013.01); *H01L 51/0055* (2013.01); *H01L 51/0094* (2013.01)

(58) Field of Classification Search
None
See application file for complete search history.

(56) References Cited

U.S. PATENT DOCUMENTS

| 9,112,039 B2 | 8/2015 | Ueda et al. |
| 2005/0001210 A1 | 1/2005 | Lee et al. |
| 2006/0113549 A1 | 6/2006 | Den et al. |
| 2009/0159880 A1 | 6/2009 | Honda et al. |
| 2010/0283049 A1 | 11/2010 | Sato et al. |
| 2015/0129862 A1 | 5/2015 | Murata |
| 2015/0349138 A1 | 12/2015 | Sone et al. |
| 2016/0013215 A1 | 1/2016 | Ueda et al. |
| 2016/0042947 A1 | 2/2016 | Nakamura et al. |
| 2016/0181098 A1 | 6/2016 | Inoue et al. |
| 2016/0190329 A1 | 6/2016 | Matsumoto et al. |
| 2016/0267873 A1 | 9/2016 | Saotome et al. |
| 2017/0054076 A1 | 2/2017 | Nagata et al. |
| 2019/0088501 A1 | 3/2019 | Inoue et al. |

FOREIGN PATENT DOCUMENTS

| CN | 1577912 | 2/2005 |
| JP | 2009-177149 | 8/2009 |
| JP | 2010-129742 | 6/2010 |

(Continued)

OTHER PUBLICATIONS

International Search Report dated Jun. 6, 2017 for counterpart International Patent Application No. PCT/JP2017/010279 filed Mar. 14, 2017 (with English Abstract).

(Continued)

*Primary Examiner* — Calvin Y Choi
(74) *Attorney, Agent, or Firm* — Oblon, McClelland, Maier & Neustadt, L.L.P.

(57) ABSTRACT

A method for producing a field-effect transistor including first-oxide-layer and second-oxide-layer and forming front-channel or back-channel in region where the first-oxide-layer and the second-oxide-layer are adjacent to each other, the method including: forming second-precursor-layer, which is precursor of the second-oxide-layer, so as to be in contact with first-precursor-layer, which is precursor of the first-oxide-layer, and then converting the first-precursor-layer and the second-precursor-layer to the first-oxide-layer and the second-oxide-layer, respectively, the forming includes at least one of treatments (I) and (II) below: (I) treatment of: coating first-oxide-precursor-forming coating liquid that can form precursor of first oxide and contains solvent; and then removing the solvent to form the first-precursor-layer which is the precursor of the first-oxide-layer; and (II) treatment of: coating second-oxide-precursor-forming coating liquid that can form precursor of second oxide and contains solvent; and then removing the solvent to form the second-precursor-layer which is the precursor of the second-oxide-layer.

6 Claims, 9 Drawing Sheets

(56) References Cited

FOREIGN PATENT DOCUMENTS

| | | |
|---|---|---|
| JP | 2011-216845 | 10/2011 |
| JP | 5118811 | 10/2012 |
| JP | 2014-123670 | 7/2014 |
| JP | 2015-046568 | 3/2015 |
| RU | 2 390 072 C2 | 12/2009 |
| TW | 200941724 | 10/2009 |
| TW | 201511291 | 3/2015 |
| TW | 201542658 | 11/2015 |
| WO | WO2014/045543 A1 | 3/2014 |
| WO | WO 2017/158930 A1 | 9/2017 |

OTHER PUBLICATIONS

Written Opinion dated Jun. 6, 2017 for counterpart International Patent Application No. PCT/JP2017/010279 filed Mar. 14, 2017.
Taiwanese First Office Action dated Aug. 11, 2017 for corresponding Taiwanese Application No. 106108544.
Taiwanese Second Office Action dated Jan. 15, 2018 for corresponding Taiwanese Application No. 106108544.
Singaporean Written Opinion dated Feb. 28, 2019 in Patent Application No. 11201807957S, 6 pages.
Combined Russian Office Action and Search Report dated May 28, 2019 in Russian Patent Application No. 2018136356 (with English translation), 14 pages.

METHOD FOR PRODUCING FIELD-EFFECT TRANSISTOR

CROSS-REFERENCE TO RELATED APPLICATIONS

The present application is a continuation application of International Application No. PCT/JP2017/010279, filed Mar. 14, 2017, which claims priority to Japanese Patent Application No. 2016-055630, filed Mar. 18, 2016 and Japanese Patent Application No. 2017-038178, filed Mar. 1, 2017. The contents of these applications are incorporated herein by reference in their entirety.

BACKGROUND OF THE INVENTION

Field of the Invention

The present disclosure relates to a method for producing a field-effect transistor.

Description of the Related Art

As one example of a field-effect transistor, a field-effect transistor using an oxide semiconductor in an active layer is known (see, for example, Japanese Patent No. 5118811).

For improvements in performances and operation stability of transistors, it is required to homogeneously form a front channel interface and a back channel interface to reduce defect density. For example, a method using an etching stopper layer has widely been used as a method of reducing defect density of a back channel by preventing an oxide semiconductor from receiving damage from an etchant during patterning of a source electrode and a drain electrode.

In recent years, a method of producing a field-effect transistor using a coating method has been proposed (see, for example, Japanese Unexamined Patent Application Publication No. 2009-177149).

In cases where the coating method is used for formation of a front channel or a back channel, the method using an etching stopper layer cannot homogeneously form the front channel interface and the back channel interface in some cases.

SUMMARY OF THE INVENTION

According to one aspect of the present disclosure, a method of the present disclosure for producing a field-effect transistor is a method for producing a field-effect transistor including a first oxide layer and a second oxide layer and forming a front channel or a back channel in a region where the first oxide layer and the second oxide layer are adjacent to each other, the method inducing an oxide-layers-forming step of forming a second precursor layer, which is a precursor of the second oxide layer, so as to be in contact with a first precursor layer, which is a precursor of the first oxide layer, and then converting the first precursor layer and the second precursor layer to the first oxide layer and the second oxide layer, respectively.

The oxide-layers-forming step includes at least one of treatments (I) and (II) below:
(I) a treatment of: coating a first-oxide-precursor-forming coating liquid that can form a precursor of a first oxide and contains a solvent; and then removing the solvent to form the first precursor layer which is the precursor of the first oxide layer; and
(II) a treatment of: coating a second-oxide-precursor-forming coating liquid that can form a precursor of a second oxide and contains a solvent; and then removing the solvent to form the second precursor layer which is the precursor of the second oxide layer.

DESCRIPTION OF THE EMBODIMENTS

Figure 1A:
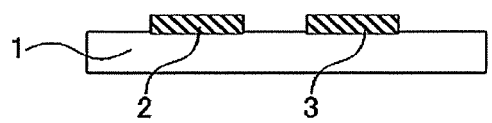
FIG. 1A is a schematic view illustrating one example of a method for producing a field-effect transistor (part 1)

The present disclosure has an object to provide a method for producing a field-effect transistor, where when a coating method is used for formation of a front channel or a back channel, the method can homogeneously form a front channel interface and a back channel interface to reduce defect density, making it possible to better transistor characteristics.

According to the present disclosure, it is possible to provide a method for producing a field-effect transistor, where when a coating method is used for formation of a front channel or a back channel, the method can homogeneously form a front channel interface and a back channel interface to reduce defect density, making it possible to better transistor characteristics.

(Method for Producing Field-Effect Transistor)

A field-effect transistor produced in the present disclosure includes a first oxide layer and a second oxide layer and forming a front channel or a back channel in a region where the first oxide layer and the second oxide layer are adjacent to each other.

A method for producing the field-effect transistor includes an oxide-layers-forming step and further includes other steps according to the necessity.

The oxide-layers-forming step is a step of forming a second precursor layer, which is a precursor of the second oxide layer, so as to be in contact with a first precursor layer, which is a precursor of the first oxide layer, and then converting the first precursor layer and the second precursor layer to the first oxide layer and the second oxide layer, respectively.

The oxide-layers-forming step includes at least one of treatments (I) and (II) below:

(I) a treatment of: coating a first-oxide-precursor-forming coating liquid that can form a precursor of a first oxide and contains a solvent; and then removing the solvent to form the first precursor layer which is the precursor of the first oxide layer; and (II) a treatment of: coating a second-oxide-precursor-forming coating liquid that can form a precursor of a second oxide and contains a solvent; and then removing the solvent to form the second precursor layer which is the precursor of the second oxide layer.

The present inventors have found that in production of a field-effect transistor, use of a coating method for formation of a front channel or a back channel causes inhomogeneity and defects of a front channel interface and a back channel interface, and damage by an etchant is not only one cause of such inhomogeneity and defects.

For example, when an oxide semiconductor or an oxide gate insulating film is formed through a high-temperature process, diffusion and aggregation of particles and atoms occur on the film surface so that the surface energy at the interface between the oxide film and the air becomes the smallest. As a result, disadvantageously, surface roughness and defect density may increase. Use of such an oxide semiconductor surface or an oxide gate insulating film surface as a front channel surface or a back channel surface causes reduction in transistor performances and instability of operation.

The present inventors conducted extensive studies based on the above finding and have found that when a coating method is used for formation of a front channel or a back channel and an oxide is formed from an oxide precursor, it is possible to reduce defect density by allowing portions to become a front channel interface and a back channel interface not to be in contact with air (not to become a free surface) and homogeneously forming the front channel interface and the back channel interface. The present inventors have accomplished the present invention on the basis of this finding.

Note that, as a result of being able to reduce defect density by homogeneously forming the front channel interface and the back channel interface, the following effects can be expected about transistor characteristics.

Reduction in defect density of the front channel leads to increased mobility.

Reduction in defect density of the front channel leads to improved subthreshold swing (SS) characteristics (which are referred to as, for example, subthreshold characteristics, S value, SS value, or S parameter). SS characteristics are defined as an increment of a gate voltage necessary to increase a drain voltage by one digit at the maximum gradient of a logarithmic graph in a subthreshold region where transfer characteristics transit from the OFF region to the ON region. Smaller SS value provides more rapid rising and superior switching characteristics.

Reduction in defect density of the front channel leads to suppressed charge trapping and improved stress reliability.

Here, the front channel means a main current path of source-drain current in the ON state of a transistor in a semiconductor layer region where induced charges are formed via a gate insulating film by voltage applied to a gate electrode. The back channel means a semiconductor layer region excluding the front channel. The front channel is also referred to simply as a channel.

<Oxide-Layers-Forming Step>

The oxide-layers-forming step is a step of forming a second precursor layer so as to be in contact with a first precursor layer and then converting the first precursor layer and the second precursor layer to the first oxide layer and the second oxide layer, respectively.

<<First Precursor Layer>>

The first precursor layer is a precursor of the first oxide layer.

The precursor of the first oxide layer means a substance that can be converted to the first oxide layer through oxidation by application of external energy. Here, the precursor of the first oxide layer may contain an oxide in a part thereof.

A method for forming the first precursor layer is not particularly limited and may be appropriately selected depending on the intended purpose. Examples of the method include the following treatment (I).

(I) A treatment of: coating a first-oxide-precursor-forming coating liquid that can form a precursor of a first oxide and contains a solvent; and then removing the solvent to form the first precursor layer which is the precursor of the first oxide layer.

The first-oxide-precursor-forming coating liquid is not particularly limited and may be appropriately selected depending on the intended purpose, so long as it can form a precursor of a first oxide and contains a solvent. Details of the first-oxide-precursor-forming coating liquid will be described below.

A method for coating the first-oxide-precursor-forming coating liquid is not particularly limited and may be appropriately selected depending on the intended purpose. Examples of the method include a spin coating method, a die coating method, an inkjet method, a nanoimprinting method, and a gravure printing method.

A method for removing the solvent is not particularly limited and may be appropriately selected depending on the intended purpose. It is preferably a method of removing the solvent by heating.

A temperature of the heating is preferably 30° C. to 300° C., more preferably 50° C. to 250° C.

A time of the heating is not particularly limited and may be appropriately selected depending on the intended purpose.

In the removal of the solvent, the solvent only needs to be removed to such an extent that can suppress flow in the resultant coated film. In that sense, the first precursor layer may contain the solvent.

<<First Oxide Layer>>

The first oxide layer is not particularly limited and may be appropriately selected depending on the intended purpose, so long as it is an oxide layer that is adjacent to the second oxide layer and includes a front channel or a back channel formed in a region where the first oxide layer and the second oxide layer are adjacent to each other. Examples of the first oxide layer include an oxide semiconductor layer and an oxide insulating layer. Examples of the oxide insulating layer include a gate insulating layer. Details of the first oxide layer will be described below.

<<Second Precursor Layer>>

The second precursor layer is a precursor of the second oxide layer.

The precursor of the second oxide layer means a substance that can be converted to the second oxide layer through oxidation by application of external energy. Here, the precursor of the second oxide layer may contain an oxide in a part thereof.

A method for forming the second precursor layer is not particularly limited and may be appropriately selected depending on the intended purpose. Examples of the method include the following treatment (II).

(II) A treatment of: coating a second-oxide-precursor-forming coating liquid that can form a precursor of a second oxide and contains a solvent; and then removing the solvent to form the second precursor layer which is the precursor of the second oxide layer.

The second-oxide-precursor-forming coating liquid is not particularly limited and may be appropriately selected depending on the intended purpose, so long as it can form a precursor of a second oxide and contains a solvent. Details of the second-oxide-precursor-forming coating liquid will be described below.

A method for coating the second-oxide-precursor-forming coating liquid is not particularly limited and may be appropriately selected depending on the intended purpose. Examples of the method include a spin coating method, a die coating method, an inkjet method, a nanoimprinting method, and a gravure printing method.

A method for removing the solvent is not particularly limited and may be appropriately selected depending on the intended purpose. It is preferably a method of removing the solvent by heating.

A temperature of the heating is preferably 30° C. to 300° C., more preferably 50° C. to 250° C.

A time of the heating is not particularly limited and may be appropriately selected depending on the intended purpose.

An atmosphere of the heating is not particularly limited and may be appropriately selected depending on the intended purpose.

In the removal of the solvent, the solvent only needs to be removed to such an extent that can suppress flow in the resultant coated film. In that sense, the second precursor layer may contain the solvent.

<<Second Oxide Layer>>

The second oxide layer is not particularly limited and may be appropriately selected depending on the intended purpose, so long as it is an oxide layer that is adjacent to the first oxide layer and includes a front channel or a back channel formed in a region where the first oxide layer and the second oxide layer are adjacent to each other. Examples of the second oxide layer include an oxide semiconductor layer and an oxide insulating layer. Examples of the oxide insulating layer include a gate insulating layer and a passivation layer. Details of the second oxide layer will be described below.

<<Conversion>>

A method for converting the first precursor layer and the second precursor layer to the first oxide layer and the second oxide layer, respectively is not particularly limited and may be appropriately selected depending on the intended purpose. Heating is preferable.

A temperature of the heating is not particularly limited and may be appropriately selected depending on the intended purpose, but is preferably 200° C. to 600° C., more preferably 250° C. to 500° C.

A time of the heating is not particularly limited and may be appropriately selected depending on the intended purpose.

An atmosphere of the heating is not particularly limited and may be appropriately selected depending on the intended purpose.

Conversion of the first precursor layer to the first oxide layer only needs to be performed to such an extent that the first oxide layer can function. For example, the first oxide layer may contain residues of the precursor as impurities.

Conversion of the second precursor layer to the second oxide layer only needs to be performed to such an extent that the second oxide layer can function. For example, the second oxide layer may contain residues of the precursor as impurities.

In the above-described manner in which lamination interfaces of the precursors are formed in advance, followed by a conversion step from the precursors to the oxides, it is possible to homogeneously form interfaces of a region to become a front channel or a back channel of a transistor, and it is possible to form interfaces having low defect density. Formation of the interfaces having low defect density results in better transistor characteristics.

In addition, it is possible to reduce the number of steps as compared with the case where a plurality of layers are individually converted to oxides from precursors.

Details of the first oxide layer and the second oxide layer will now be described. Note in the following description that, "oxide layer" means the first oxide layer or the second oxide layer.

<<<Case where the Oxide Layer is an Oxide Semiconductor Layer>>>
—Oxide Semiconductor Layer (Oxide Layer)—

A material of the oxide semiconductor layer is not particularly limited and may be appropriately selected depending on the intended purpose. Examples of the material include n-type oxide semiconductors and p-type oxide semiconductors.

Examples of the n-type oxide semiconductors include $ZnO$, $SnO_2$, $In_2O_3$, $TiO_2$, and $Ga_2O_3$. Also, the n-type oxide semiconductors may be oxides containing a plurality of metals, such as In—Zn-based oxides, In—Sn-based oxides, In—Ga-based oxides, Sn—Zn-based oxides, Sn—Ga-based oxides, Zn—Ga-based oxides, In—Zn—Sn-based oxides, In—Ga—Zn-based oxides, In—Sn—Ga-based oxides, Sn—Ga—Zn-based oxides, In—Al—Zn-based oxides, Al—Ga—Zn-based oxides, Sn—Al—Zn-based oxides, In—Hf—Zn-based oxides, and In—Al—Ga—Zn-based oxides.

The n-type oxide semiconductors preferably contain at least one selected from the group consisting of indium, zinc, tin, gallium, and titanium and at least one alkaline earth metal, more preferably indium and at least one alkaline earth metal, in terms of being able to obtain high field-effect mobility and of easiness to appropriately control electron carrier density.

—Precursor of the Oxide Semiconductor Layer (Precursor Layer)—

A material of the precursor of the oxide semiconductor layer is not particularly limited and may be appropriately selected depending on the intended purpose. Examples of the material include inorganic metal compounds and organic metal compounds.

The inorganic metal compounds are not particularly limited and may be appropriately selected depending on the intended purpose. Examples of the inorganic metal compounds include inorganic indium compounds and inorganic alkaline-earth-metal-containing compounds.

The inorganic indium compounds are not particularly limited and may be appropriately selected depending on the intended purpose. Examples of the inorganic indium compounds include: salts such as indium nitrate, indium sulfate, indium hydroxide, indium carbonate, indium phosphate, and indium cyanide; and halides such as indium chloride, indium bromide, and indium iodide.

Among the inorganic indium compounds, indium nitrate, indium sulfate, and indium chloride are particularly preferable because these have high solubility in various solvents.

The indium nitrate is not particularly limited and may be appropriately selected depending on the intended purpose. Examples of the indium nitrate include indium nitrate hydrates. Examples of the indium nitrate hydrates include indium nitrate trihydrate and indium nitrate pentahydrate.

Examples of the inorganic alkaline-earth-metal-containing compounds include nitrates of alkaline earth metals, sulfates of alkaline earth metals, chlorides of alkaline earth metals, fluorides of alkaline earth metals, bromides of alkaline earth metals, and iodides of alkaline earth metals. Specific examples of the inorganic alkaline-earth-metal-containing compounds include calcium nitrate, calcium sulfate, calcium chloride, strontium nitrate, strontium sulfate, and strontium chloride.

The organic metal compounds are not particularly limited and may be appropriately selected depending on the intended purpose, so long as the organic metal compounds are each a compound containing the metal and an organic group. The metal and the organic group are bonded, for example, via an ionic bond, a covalent bond, or a coordinate bond.

The organic group is not particularly limited and may be appropriately selected depending on the intended purpose. Examples of the organic group include alkyl groups which may have substituents, alkoxy groups which may have substituents, acyloxy groups which may have substituents, acetyl acetonate groups which may have substituents, and cyclopentadienyl groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include acyloxy groups containing from 1 through 10 carbon atoms.

—Oxide-Semiconductor-Precursor-Forming Coating Liquid (Oxide-Precursor-Forming Coating Liquid)—

The oxide-semiconductor-precursor-forming coating liquid as the oxide-precursor-forming coating liquid can form a precursor of the oxide semiconductor.

The oxide-semiconductor-precursor-forming coating liquid contains a solvent.

The solvent is not particularly limited and may be appropriately selected depending on the intended purpose, but is preferably an organic solvent.

Examples of the organic solvent include hydrocarbons such as tetradecane; cyclic hydrocarbons such as cyclohexane and cyclododecene; aromatic hydrocarbons such as toluene, xylene, and mesitylene; glycol ethers such as diethylene glycol monoethyl ether; monoalcohol ethers such as ethylene glycol monomethyl ether; polyvalent alcohols such as ethylene glycol and propylene glycol; and monoalcohols such as butanol. These may be used alone or in combination.

<<<Case where the Oxide Layer is a Gate Insulating Layer>>>

—Gate Insulating Layer (Oxide Layer)—

The gate insulating layer is a layer that is provided between a gate electrode and an oxide semiconductor layer serving as an active layer and is configured to achieve insulation between the gate electrode and the active layer.

An average film thickness of the gate insulating layer is not particularly limited and may be appropriately selected depending on the intended purpose, but is preferably 50 nm to 3 µm, more preferably 100 nm to 1 µm.

The gate insulating layer is not particularly limited and may be appropriately selected depending on the intended purpose. Examples of the material include metal oxide films.

For example, the metal oxide films contain a Group A element which is an alkaline earth metal and a Group B element which is at least one selected from the group consisting of gallium (Ga), scandium (Sc), yttrium (Y), and lanthanoid, preferably contain a Group C element which is at least one selected from the group consisting of zirconium (Zr) and hafnium (Hf), and further contain other ingredients according to the necessity.

One kind of the alkaline earth metal or two or more kinds of the alkaline earth metal may be contained in the metal oxide film. Examples of the alkaline earth metal include beryllium (Be), magnesium (Mg), calcium (Ca), strontium (Sr), barium (Ba), and radium (Ra).

Examples of the lanthanoid include lanthanum (La), cerium (CO, praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

—Precursor of the Gate Insulating Layer (Precursor Layer)—

A material of the precursor of the gate insulating layer is, for example, an alkaline-earth-metal-containing compound, a Group-B-element-containing compound, or a Group-C-element-containing compound.

Here, the Group B element in the Group-B-element-containing compound is at least one selected from the group consisting of Ga, Sc, Y, and lanthanoid.

Here, the Group C element in the Group-C-element-containing compound is at least one selected from the group consisting of Al, Ti, Zr, Hf, Nb, and Ta.

Examples of the alkaline-earth-metal-containing compound include inorganic alkaline-earth-metal compounds and organic alkaline-earth-metal compounds.

Examples of the inorganic alkaline-earth-metal compounds include nitrates of the alkaline earth metals, sulfates of the alkaline earth metals, chlorides of the alkaline earth metals, fluorides of the alkaline earth metals, bromides of the alkaline earth metals, and iodides of the alkaline earth metals.

The organic alkaline-earth-metal compounds are not particularly limited and may be appropriately selected depending on the intended purpose, so long as the organic alkaline-earth-metal compounds are each a compound containing an alkaline earth metal and an organic group. The alkaline earth metal and the organic group are bonded, for example, via an ionic bond, a covalent bond, or a coordinate bond.

The organic group is not particularly limited and may be appropriately selected depending on the intended purpose. Examples of the organic group include alkyl groups which may have substituents, alkoxy groups which may have substituents, acyloxy groups which may have substituents, acetyl acetonate groups which may have substituents, and cyclopentadienyl groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include acyloxy groups containing from 1 through 10 carbon atoms.

Examples of the Group-B-element-containing compound include inorganic Group-B-element compounds and organic Group-B-element compounds.

Examples of the inorganic Group-B-element compounds include nitrates of the Group B elements, sulfates of the Group B elements, fluorides of the Group B elements, chlorides of the Group B elements, bromides of the Group B elements, and iodides of the Group B elements.

The organic Group-B-element compounds are not particularly limited and may be appropriately selected depending on the intended purpose, so long as the organic Group-B-element compounds are each a compound containing a Group B element and an organic group. The Group B element and the organic group are bonded, for example, via an ionic bond, a covalent bond, or a coordinate bond.

The organic group is not particularly limited and may be appropriately selected depending on the intended purpose. Examples of the organic group include alkyl groups which may have substituents, alkoxy groups which may have substituents, acyloxy groups which may have substituents, acetyl acetonate groups which may have substituents, and cyclopentadienyl groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include acyloxy groups containing from 1 through 10 carbon atoms.

Examples of the Group-C-element-containing compound include inorganic compounds of Group C elements and organic compounds of Group C elements.

Examples of the inorganic compounds of Group C elements include nitrates of the Group C elements, sulfates of the Group C elements, fluorides of the Group C elements, chlorides of the Group C elements, bromides of the Group C elements, and iodides of the Group C elements.

The organic compounds of Group C elements are not particularly limited and may be appropriately selected depending on the intended purpose, so long as the organic compounds of Group C elements are each a compound containing a Group C element and an organic group. The Group C element and the organic group are bonded, for example, via an ionic bond, a covalent bond, or a coordinate bond.

The organic group is not particularly limited and may be appropriately selected depending on the intended purpose. Examples of the organic group include alkyl groups which may have substituents, alkoxy groups which may have substituents, acyloxy groups which may have substituents, acetyl acetonate groups which may have substituents, and cyclopentadienyl groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include acyloxy groups containing from 1 through 10 carbon atoms.

—Gate-Insulating-Layer-Precursor-Forming Coating Liquid (Oxide-Precursor-Forming Coating Liquid)—

A gate-insulating-layer-precursor-forming coating liquid serving as the oxide-precursor-forming coating liquid can form the precursor of a gate insulating layer.

The gate-insulating-layer-precursor-forming coating liquid contains a solvent.

The solvent is not particularly limited and may be appropriately selected depending on the intended purpose, so long as it is a solvent that can stably dissolve or disperse the above various compounds. Examples of the solvent include toluene, xylene, mesitylene, cymene, pentylbenzene, dodecylbenzene, bicyclohexyl, cyclohexylbenzene, decane, undecane, dodecane, tridecane, tetradecane, pentadecane, tetralin, decalin, isopropanol, ethyl benzoate, N,N-dimethylformamide, propylene carbonate, 2-ethyl hexanoate, mineral spirits, dimethylpropylene urea, 4-butyrolactone, 2-methoxy ethanol, and water.

<<<Case where the Oxide Layer is a Passivation Layer>>>
—Passivation Layer (Oxide Layer)—

The passivation layer is a layer configured to protect the oxide semiconductor layer from moisture, hydrogen, and oxygen contained in the atmosphere. Also, the passivation layer is a layer configured to protect the oxide semiconductor layer in production steps after the formation of the oxide semiconductor layer. Examples of the production steps include an etching step.

An average thickness of the passivation layer is not particularly limited and may be appropriately selected depending on the intended purpose, but is preferably 10 nm to 3 μm, more preferably 30 nm to 1 μm.

A material of the passivation layer is not particularly limited and may be appropriately selected depending on the intended purpose. Examples of the material include metal oxides.

Examples of the metal oxides include metal oxides containing alkaline earth metals and Si, and metal oxides containing alkaline earth metals and rare-earth elements. The metal oxides further contain other ingredients according to the necessity.

One kind of the alkaline earth metal or two or more kinds of the alkaline earth metal may be contained in the metal oxide. Examples of the alkaline earth metal include beryllium (Be), magnesium (Mg), calcium (Ca), strontium (Sr), barium (Ba), and radium (Ra).

Examples of the rare-earth elements contained in the metal oxides include scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

—Precursor of the Passivation Layer (Precursor Layer)—

A material of the precursor of the passivation layer is, for example, a silicon-containing compound, an alkaline-earth-metal-containing compound, or a rare-earth-element-containing compound.

Examples of the silicon-containing compound include inorganic silicon compounds and organic silicon compounds.

Examples of the inorganic silicon compounds include tetrachlorosilane, tetrabromosilane, and tetraiodosilane.

The organic silicon compounds are not particularly limited and may be appropriately selected depending on the intended purpose, so long as the organic silicon compounds are each a compound containing silicon and an organic group. The silicon and the organic group are bonded, for example, via an ionic bond, a covalent bond, or a coordinate bond.

The organic group is not particularly limited and may be appropriately selected depending on the intended purpose. Examples of the organic group include alkyl groups which may have substituents, alkoxy groups which may have substituents, acyloxy groups which may have substituents, and phenyl groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include acyloxy groups containing from 1 through 10 carbon atoms.

Examples of the organic silicon compounds include tetramethoxysilane, tetraethoxysilane, tetraisopropoxysilane, tetrabutoxysilane, 1,1,1,3,3,3-hexamethyldisilazane (HMDS), bis(trimethylsilyl)acetylene, triphenylsilane, silicon 2-ethylhexanoate, and tetraacetoxysilane.

Examples of the alkaline-earth-metal-containing compound include inorganic alkaline-earth-metal compounds and organic alkaline-earth-metal compounds.

Examples of the inorganic alkaline-earth-metal compounds include nitrates of the alkaline earth metals, sulfates of the alkaline earth metals, chlorides of the alkaline earth metals, fluorides of the alkaline earth metals, bromides of the alkaline earth metals, and iodides of the alkaline earth metals.

The organic alkaline-earth-metal compounds are not particularly limited and may be appropriately selected depending on the intended purpose, so long as the organic alkaline-earth-metal compounds are each a compound containing an alkaline earth metal and an organic group. The alkaline earth metal and the organic group are bonded, for example, via an ionic bond, a covalent bond, or a coordinate bond.

The organic group is not particularly limited and may be appropriately selected depending on the intended purpose. Examples of the organic group include alkyl groups which may have substituents, alkoxy groups which may have substituents, acyloxy groups which may have substituents, acetyl acetonate groups which may have substituents, and cyclopentadienyl groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include acyloxy groups containing from 1 through 10 carbon atoms.

Examples of the rare-earth-element-containing compound include rare-earth-element inorganic compounds (inorganic compounds of rare earth elements) and rare-earth-element organic compounds (organic compounds of rare earth elements).

Examples of the inorganic compounds of rare earth elements include nitrates of rare earth elements, sulfates of rare earth elements, fluorides of rare earth elements, chlorides of rare earth elements, bromides of rare earth elements, and iodides of rare earth elements.

The organic compounds of rare earth elements are not particularly limited and may be appropriately selected depending on the intended purpose, so long as the organic compounds of rare earth elements are each a compound containing a rare earth element and an organic group. The rare earth element and the organic group are bonded, for example, via an ionic bond, a covalent bond, or a coordinate bond.

The organic group is not particularly limited and may be appropriately selected depending on the intended purpose.

Examples of the organic group include alkyl groups which may have substituents, alkoxy groups which may have substituents, acyloxy groups which may have substituents, acetyl acetonate groups which may have substituents, and cyclopentadienyl groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include acyloxy groups containing from 1 through 10 carbon atoms.
—Passivation-Layer-Precursor-Forming Coating Liquid (Oxide-Precursor-Forming Coating Liquid)—

A passivation-layer-precursor-forming coating liquid serving as the oxide-precursor-forming coating liquid can form a precursor of the passivation layer.

The passivation-layer-precursor-forming coating liquid contains a solvent.

The solvent is not particularly limited and may be appropriately selected depending on the intended purpose, so long as it is a solvent that can stably dissolve or disperse the above various compounds. Examples of the solvent include toluene, xylene, mesitylene, cymene, pentylbenzene, dodecylbenzene, bicyclohexyl, cyclohexylbenzene, decane, undecane, dodecane, tridecane, tetradecane, pentadecane, tetralin, decalin, isopropanol, ethyl benzoate, N,N-dimethylformamide, propylene carbonate, 2-ethyl hexanoate, mineral spirits, dimethylpropylene urea, 4-butyrolactone, 2-methoxy ethanol, and water.

Combinations of the first oxide layer and the second oxide layer include the following combinations.
(i) A combination in which the first oxide layer is a gate insulating layer and the second oxide layer is an oxide semiconductor layer. In this combination, a front channel is formed in a region where the first oxide layer and the second oxide layer are adjacent to each other.
(ii) A combination in which the first oxide layer is an oxide semiconductor layer and the second oxide layer is a gate insulating layer. In this combination, a front channel is formed in a region where the first oxide layer and the second oxide layer are adjacent to each other.
(iii) A combination in which the first oxide layer is an oxide semiconductor layer and the second oxide layer is a passivation layer. In this combination, a back channel is formed in a region where the first oxide layer and the second oxide layer are adjacent to each other.

In the above (i) and (ii), when the resultant field-effect transistor includes a passivation layer and the passivation layer is an oxide, the passivation layer may be obtained through a coating process or a vacuum process.

In the above (iii), when a gate insulating layer of the resultant field-effect transistor is an oxide, the gate insulating layer may be obtained through a coating process or a vacuum process.

<Other Steps>

Examples of the other steps include a gate-electrode-forming step and a source/drain-electrode-forming step.

<<Gate-Electrode-Forming Step>>

The gate-electrode-forming step is not particularly limited and may be appropriately selected depending on the intended purpose, so long as it is a step of forming a gate electrode. Examples of the gate-electrode-forming step include: (i) a step of forming a film by a sputtering method or a dip coating method and patterning the film through photolithography; and (ii) a step of directly forming a film having a desired shape through a printing process, such as inkjet printing, nanoimprinting, or gravure printing.

The gate electrode is not particularly limited and may be appropriately selected depending on the intended purpose, so long as it is an electrode configured to apply gate voltage.

A material of the gate electrode is not particularly limited and may be appropriately selected depending on the intended purpose. Examples of the material include metals (e.g., platinum, palladium, gold, silver, copper, zinc, aluminium, nickel, chromium, tantalum, molybdenum, and titanium), alloys of these metals, and mixtures of these metals. Further examples of the material include: conductive oxides, such as indium oxide, zinc oxide, tin oxide, gallium oxide, niobium oxide, tin (Sn)-added $In_2O_3$ (ITO), gallium (Ga)-added ZnO, aluminium (Al)-added ZnO, and antimony (Sb)-added $SnO_2$; complex compounds of these; and mixtures of these.

An average thickness of the gate electrode is not particularly limited and may be appropriately selected depending on the intended purpose, but is preferably 10 nm to 200 nm, more preferably 50 nm to 100 nm.

The gate electrode is formed on, for example, a substrate.

A shape, a structure, and a size of the substrate are not particularly limited and may be appropriately selected depending on the intended purpose.

A material of the substrate is not particularly limited and may be appropriately selected depending on the intended purpose. Examples of the material include glass substrates and plastic substrates.

The glass substrates are not particularly limited and may be appropriately selected depending on the intended purpose. Examples of the glass substrates include alkali-free glass and silica glass.

The plastic substrates are not particularly limited and may be appropriately selected depending on the intended purpose. Examples of the plastic substrates include polycarbonate (PC), polyimide (PI), polyethylene terephthalate (PET), and polyethylene naphthalate (PEN).

The substrate is preferably subjected to a pre-treatment (e.g., washing through oxygen plasma, UV-ozone, and UV irradiation) in order to clean the surface of the substrate and to improve close adhesiveness.

<<Source/Drain-Electrode-Forming Step>>

The source/drain-electrode-forming step is not particularly limited and may be appropriately selected depending on the intended purpose, so long as it is a step of forming a source electrode and a drain electrode. Examples of the source/drain-electrode-forming step include: (i) a step of forming a film by a sputtering method or a dip coating method and patterning the film through photolithography; and (ii) a step of directly forming a film having a desired shape through a printing process, such as inkjet printing, nanoimprinting, or gravure printing.

A material of the source electrode and the drain electrode is not particularly limited and may be appropriately selected depending on the intended purpose. Examples of the material include the materials exemplified in the description for the gate electrode.

An average thickness of the source electrode and the drain electrode is not particularly limited and may be appropriately selected depending on the intended purpose, but is preferably 10 nm to 200 nm, more preferably 50 nm to 100 nm.

Referring now to the drawings, one example of the method of the present disclosure for producing a field-effect transistor will be described.

FIG. 1A to FIG. 1E are schematic views illustrating one example of the method for producing a field-effect transistor.

First, a source electrode 2 and a drain electrode 3 are formed on a substrate 1 (FIG. 1A).

Figure 1B:
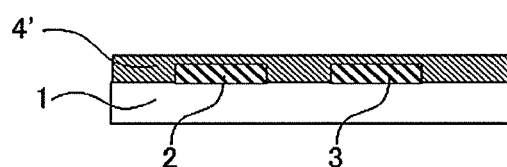
FIG. 1B is a schematic view illustrating one example of a method for producing a field-effect transistor (part 2)

Next, an oxide-semiconductor-precursor-forming coating liquid serving as the oxide-precursor-forming coating liquid is coated on the substrate 1, the source electrode 2, and the drain electrode 3, to form a precursor 4' of an oxide semiconductor layer as a first precursor layer (FIG. 1B).

Figure 1C:
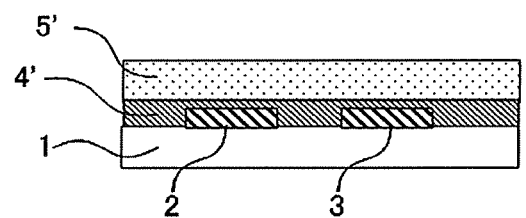
FIG. 1C is a schematic view illustrating one example of a method for producing a field-effect transistor (part 3)

Next, a gate-insulating-layer-precursor-forming coating liquid serving as the oxide-precursor-forming coating liquid is coated on the precursor 4' of the oxide semiconductor layer, to form a precursor 5' of a gate insulating layer as a second precursor layer (FIG. 1C).

Figure 1D:
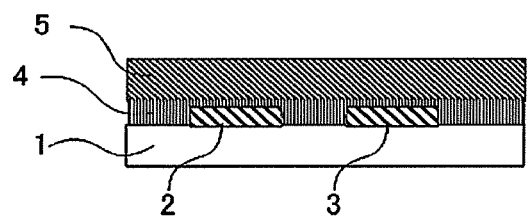
FIG. 1D is a schematic view illustrating one example of a method for producing a field-effect transistor (part 4)

Next, the precursor 4' of the oxide semiconductor layer and the precursor 5' of the gate insulating layer are heated and converted to an oxide semiconductor layer 4 (an oxide layer) and a gate insulating layer 5 (an oxide layer), respectively (FIG. 1D).

Figure 1E:
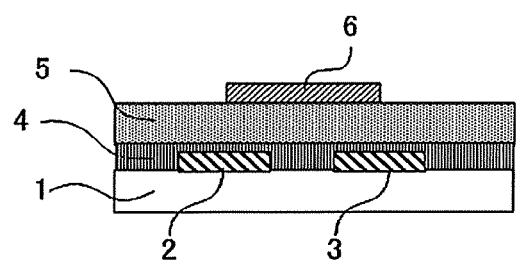
FIG. 1E is a schematic view illustrating one example of a method for producing a field-effect transistor (part 5)

Next, a gate electrode 6 is formed on the gate insulating layer 5 (FIG. 1E).

Through the above procedure, a top gate/bottom contact field-effect transistor is obtained.

FIG. 2A to FIG. 2E are schematic views illustrating one example of the method for producing a field-effect transistor.

Figure 2A:
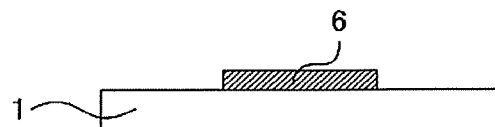
FIG. 2A is a schematic view illustrating another example of a method for producing a field-effect transistor (part 1)

First, a gate electrode 6 is formed on a substrate 1 (FIG. 2A).

Figure 2B:
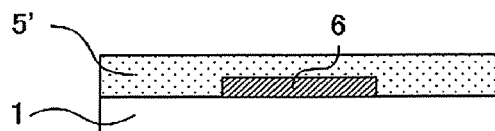
FIG. 2B is a schematic view illustrating another example of a method for producing a field-effect transistor (part 2)

Next, a gate-insulating-layer-precursor-forming coating liquid serving as the oxide-precursor-forming coating liquid is coated on the substrate 1 and the gate electrode 6, to form a precursor 5' of a gate insulating layer as a first precursor layer (FIG. 2B).

Figure 2C:
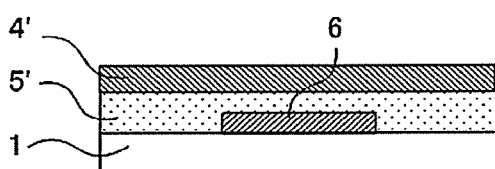
FIG. 2C is a schematic view illustrating another example of a method for producing a field-effect transistor (part 3)

Next, an oxide-semiconductor-precursor-forming coating liquid serving as the oxide-precursor-forming coating liquid is coated on the precursor 5' of the gate insulating layer, to form a precursor 4' of an oxide semiconductor layer as a second precursor layer (FIG. 2C).

Figure 2D:
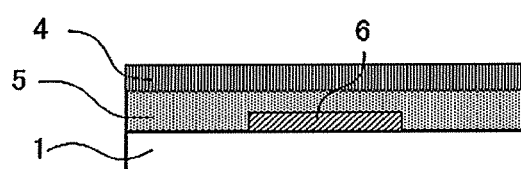
FIG. 2D is a schematic view illustrating another example of a method for producing a field-effect transistor (part 4)

Next, the precursor 4' of the oxide semiconductor layer and the precursor 5' of the gate insulating layer are heated and converted to an oxide semiconductor layer 4 (an oxide layer) and a gate insulating layer 5 (an oxide layer), respectively (FIG. 2D).

Figure 2E:
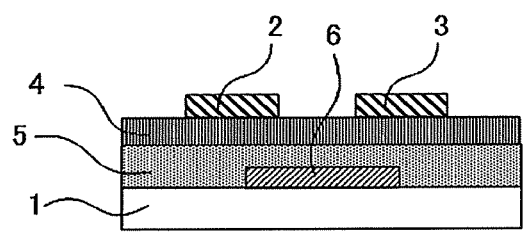
FIG. 2E is a schematic view illustrating another example of a method for producing a field-effect transistor (part 5)

Next, a source electrode 2 and a drain electrode 3 are formed on the oxide semiconductor layer 4 (FIG. 2E).

Through the above procedure, a bottom gate/top contact field-effect transistor is obtained.

FIG. 3A to FIG. 3F are schematic views illustrating one example of the method for producing a field-effect transistor.

Figure 3A:
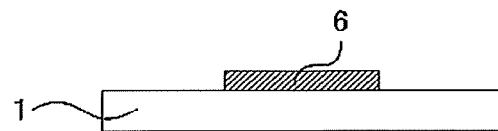
FIG. 3A is a schematic view illustrating still another example of a method for producing a field-effect transistor (part 1)

First, a gate electrode 6 is formed on a substrate 1 (FIG. 3A).

Figure 3B:
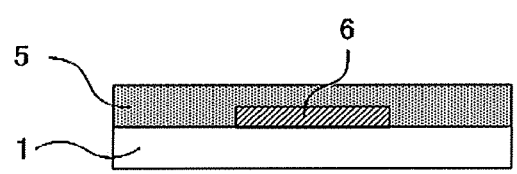
FIG. 3B is a schematic view illustrating still another example of a method for producing a field-effect transistor (part 2)

Next, a gate insulating layer 5 is formed on the substrate 1 and the gate electrode 6 (FIG. 3B).

Figure 3C:
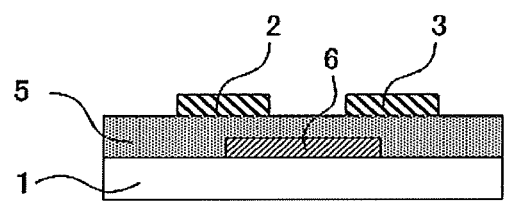
FIG. 3C is a schematic view illustrating still another example of a method for producing a field-effect transistor (part 3)

Next, a source electrode 2 and a drain electrode 3 are formed on the gate insulating layer 5 (FIG. 3C).

Figure 3D:
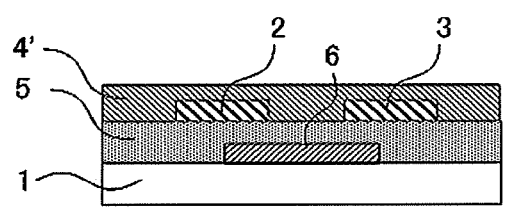
FIG. 3D is a schematic view illustrating still another example of a method for producing a field-effect transistor (part 4)

Next, an oxide-semiconductor-precursor-forming coating liquid serving as the oxide-precursor-forming coating liquid is coated on the gate insulating layer 5, the source electrode 2, and the drain electrode 3, to form a precursor 4' of an oxide semiconductor layer as a first precursor layer (FIG. 3D).

Figure 3E:
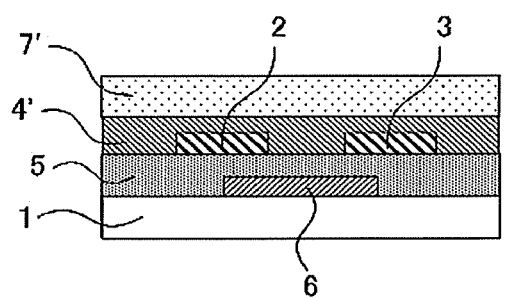
FIG. 3E is a schematic view illustrating still another example of a method for producing a field-effect transistor (part 5)

Next, a passivation-layer-forming coating liquid serving as the oxide-precursor-forming coating liquid is coated on the precursor 4' of the oxide semiconductor layer, to form a precursor 7' of a passivation layer as a second precursor layer (FIG. 3E).

Figure 3F:
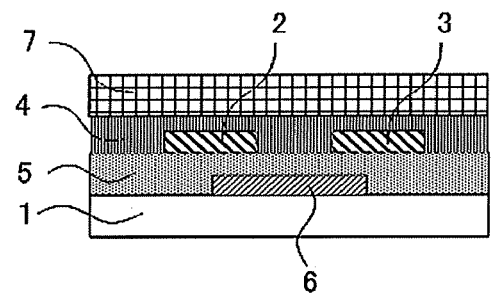
FIG. 3F is a schematic view illustrating still another example of a method for producing a field-effect transistor (part 6)

Next, the precursor 4' of the oxide semiconductor layer and the precursor 7' of the passivation layer are heated and converted to an oxide semiconductor layer 4 (an oxide layer) and a passivation layer 7 (an oxide layer), respectively (FIG. 3F).

Through the above procedure, a bottom gate/bottom contact field-effect transistor is obtained.

FIG. 4A to FIG. 4H are schematic views illustrating one example of the method for producing a field-effect transistor.

Figure 4A:
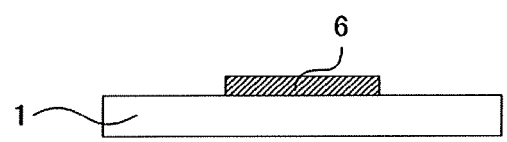
FIG. 4A is a schematic view illustrating yet another example of a method for producing a field-effect transistor (part 1)

First, a gate electrode 6 is formed on a substrate 1 (FIG. 4A).

Figure 4B:
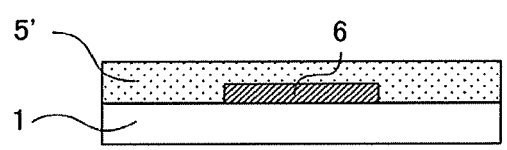
FIG. 4B is a schematic view illustrating yet another example of a method for producing a field-effect transistor (part 2)

Next, a gate-insulating-layer-precursor-forming coating liquid serving as the oxide-precursor-forming coating liquid is coated on the substrate 1 and the gate electrode 6, to form a precursor 5' of a gate insulating layer as a first precursor layer (FIG. 4B).

Figure 4C:
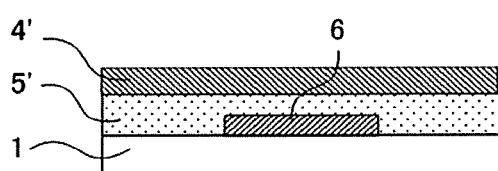
FIG. 4C is a schematic view illustrating yet another example of a method for producing a field-effect transistor (part 3)

Next, an oxide-semiconductor-precursor-forming coating liquid serving as the oxide-precursor-forming coating liquid is coated on the precursor 5' of the gate insulating layer, to form a precursor 4' of an oxide semiconductor layer as a second precursor layer (FIG. 4C).

Figure 4D:
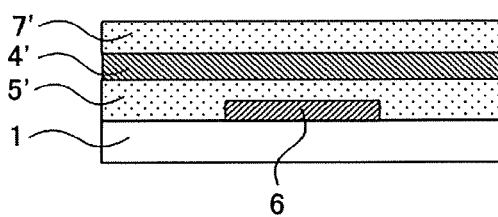
FIG. 4D is a schematic view illustrating yet another example of a method for producing a field-effect transistor (part 4)

Next, a passivation-layer-forming coating liquid serving as the oxide-precursor-forming coating liquid is coated on the precursor 4' of the oxide semiconductor layer, to form a precursor 7' of a passivation layer as a third precursor layer (FIG. 4D).

Figure 4E:
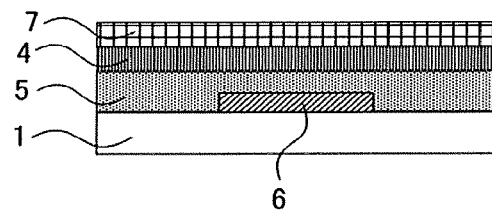
FIG. 4E is a schematic view illustrating yet another example of a method for producing a field-effect transistor (part 5)

Next, the precursor 5' of the gate insulating layer, the precursor 4' of the oxide semiconductor layer, and the precursor 7' of the passivation layer are heated and converted to a gate insulating layer 5 (an oxide layer), an oxide semiconductor layer 4 (an oxide layer), and a passivation layer 7 (an oxide layer), respectively (FIG. 4E).

Figure 4F:
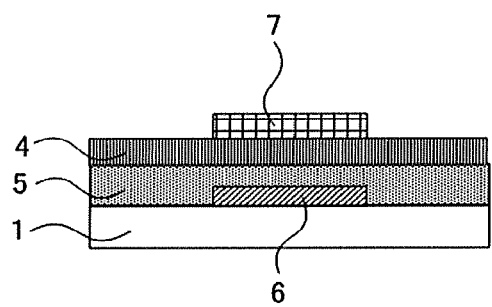
FIG. 4F is a schematic view illustrating yet another example of a method for producing a field-effect transistor (part 6)

Next, a portion of the passivation layer 7 corresponding to a channel region is retained and the other portions are removed (FIG. 4F). This passivation layer 7 functions as an etching stopper layer configured to protect the oxide semiconductor layer 4 from film forming processes and patterning processes such as etching in the formation of the source electrode and the drain electrode.

Figure 4G:
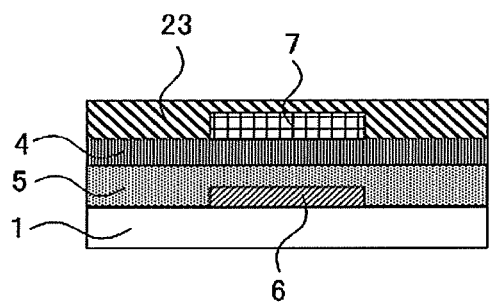
FIG. 4G is a schematic view illustrating yet another example of a method for producing a field-effect transistor (part 7)

Next, an electrode film 23 is formed on the oxide semiconductor layer 4 and the passivation layer 7 (FIG. 4G).

Figure 4H:
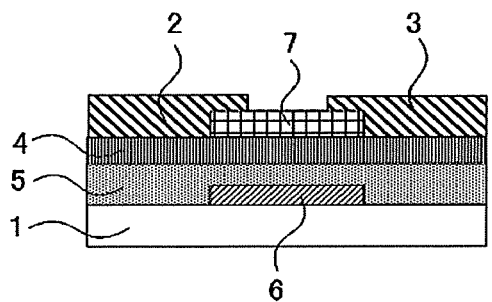
FIG. 4H is a schematic view illustrating yet another example of a method for producing a field-effect transistor (part 8)

Next, a patterning technique including etching is used to form a source electrode 2 and a drain electrode 3 from the electrode film 23 (FIG. 4H).

Through the above procedure, a bottom gate/top contact field-effect transistor including an etching stopper is obtained.

FIG. 5A to FIG. 5H are schematic views illustrating one example of the method for producing a field-effect transistor.

Figure 5A:
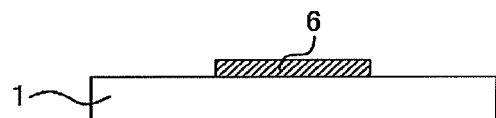
FIG. 5A is a schematic view illustrating yet another example of a method for producing a field-effect transistor (part 1)

First, a gate electrode 6 is formed on a substrate 1 (FIG. 5A).

Figure 5B:
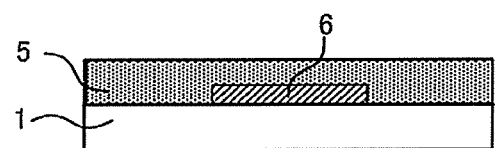
FIG. 5B is a schematic view illustrating yet another example of a method for producing a field-effect transistor (part 2)

Next, a gate insulating layer 5 is formed on the substrate 1 and the gate electrode 6 (FIG. 5B).

Figure 5C:
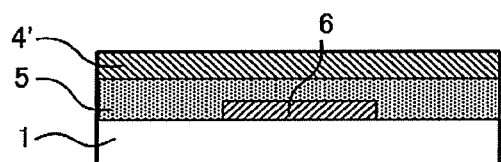
FIG. 5C is a schematic view illustrating yet another example of a method for producing a field-effect transistor (part 3)

Next, an oxide-semiconductor-precursor-forming coating liquid serving as the oxide-precursor-forming coating liquid is coated on the gate insulating layer 5, to form a precursor 4' of an oxide semiconductor layer as a first precursor (FIG. 5C).

Figure 5D:
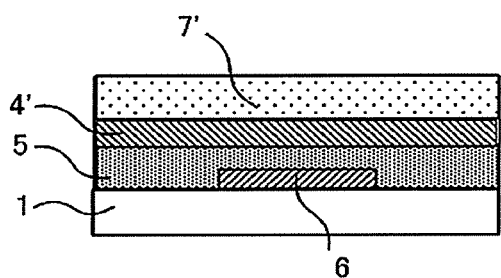
FIG. 5D is a schematic view illustrating yet another example of a method for producing a field-effect transistor (part 4)

Next, a passivation-layer-forming coating liquid serving as the oxide-precursor-forming coating liquid is coated on the precursor 4' of the oxide semiconductor layer, to form a precursor 7' of a passivation layer as a second precursor (FIG. 5D).

Figure 5E:
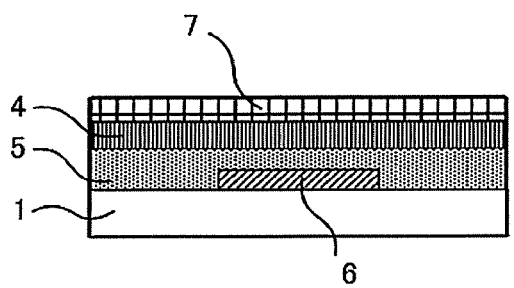
FIG. 5E is a schematic view illustrating yet another example of a method for producing a field-effect transistor (part 5)

Next, the precursor 4' of the oxide semiconductor layer and the precursor 7' of the passivation layer are heated and converted to an oxide semiconductor layer 4 (an oxide layer) and a passivation layer 7 (an oxide layer), respectively (FIG. 5E).

Figure 5F:
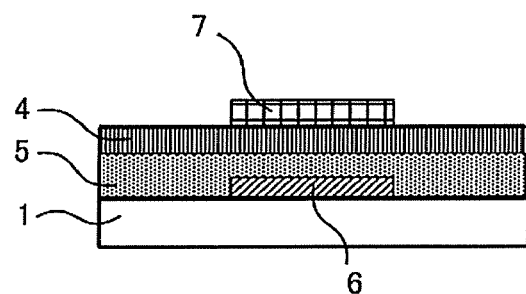
FIG. 5F is a schematic view illustrating yet another example of a method for producing a field-effect transistor (part 6)

Next, a portion of the passivation layer 7 corresponding to a channel region is retained and the other portions are removed (FIG. 5F). This passivation layer 7 functions as an etching stopper configured to protect the oxide semiconductor layer 4 from film forming processes and patterning processes such as etching in the formation of the source electrode and the drain electrode.

Figure 5G:
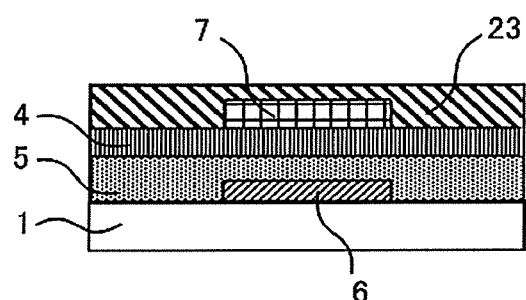
FIG. 5G is a schematic view illustrating yet another example of a method for producing a field-effect transistor (part 7)

Next, an electrode film 23 is formed on the oxide semiconductor layer 4 and the passivation layer 7 (FIG. 5G).

Figure 5H:
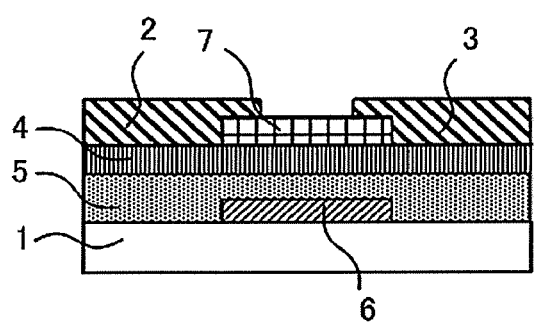
FIG. 5H is a schematic view illustrating yet another example of a method for producing a field-effect transistor (part 8)

Next, a patterning technique including etching is used to form a source electrode 2 and a drain electrode 3 from the electrode film 23 (FIG. 5H).

Through the above procedure, a bottom gate/top contact field-effect transistor including an etching stopper is obtained.

FIG. 6A to FIG. 6F are schematic views illustrating one example of the method for producing a field-effect transistor.

Figure 6A:
FIG. 6A is a schematic view illustrating yet another example of a method for producing a field-effect transistor (part 1)

First, an oxide-semiconductor-precursor-forming coating liquid serving as the oxide-precursor-forming coating liquid is coated on a substrate 1, to form a precursor 4' of an oxide semiconductor layer as a first precursor (FIG. 6A).

Figure 6B:
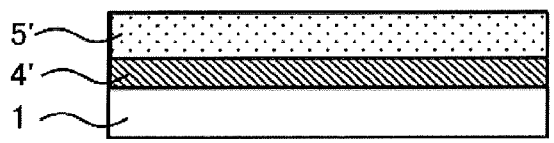
FIG. 6B is a schematic view illustrating yet another example of a method for producing a field-effect transistor (part 2)

Next, a gate-insulating-layer-precursor-forming coating liquid serving as the oxide-precursor-forming coating liquid is coated on a the precursor 4' of the oxide semiconductor layer, to form a precursor 5' of a gate insulating layer as a second precursor layer (FIG. 6B).

Figure 6C:
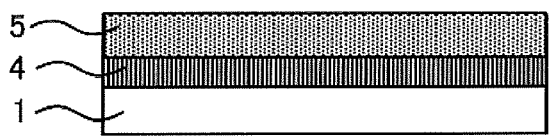
FIG. 6C is a schematic view illustrating yet another example of a method for producing a field-effect transistor (part 3)

Next, the precursor 4' of the oxide semiconductor layer and the precursor 5' of the gate insulating layer are heated and converted to an oxide semiconductor layer 4 (an oxide layer) and a gate insulating layer 5 (an oxide layer), respectively (FIG. 6C).

Figure 6D:
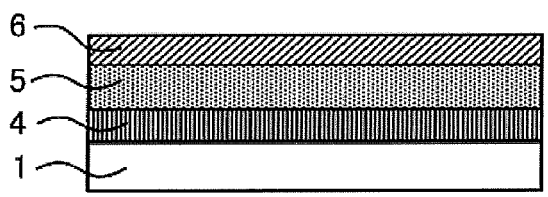
FIG. 6D is a schematic view illustrating yet another example of a method for producing a field-effect transistor (part 4)

Next, a gate electrode 6 is formed on the gate insulating layer 5 (FIG. 6D).

Figure 6E:
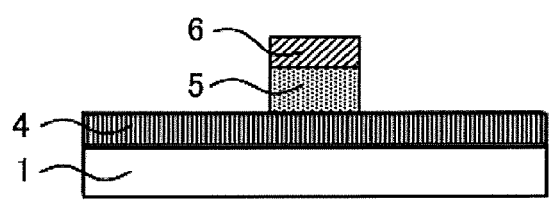
FIG. 6E is a schematic view illustrating yet another example of a method for producing a field-effect transistor (part 5)

Next, a portion of the gate electrode 6 corresponding to a channel region is retained and the other portions are removed. Further, the gate insulating layer 6 in a region where the gate electrode 6 is not formed is removed by etching (FIG. 6E).

Next, an interlayer insulating layer 8 is formed to cover the oxide semiconductor layer 4, the gate electrode 6, and the gate insulating layer 5. Further, two holes reaching the oxide semiconductor layer 4 are formed in the interlayer insulating layer 8 at positions facing each other via the gate electrode 6 and the gate insulating layer 5. Moreover, a source electrode 2 and a drain electrode 3 are formed so as to charge the two holes.

Through the above procedure, a top gate/top contact field-effect transistor including an etching stopper is obtained.

EXAMPLES

The present disclosure will next be described by way of Examples, but the Examples should not be construed to limit the present disclosure in any way.

Example 1

<Production of Top Gate/Bottom Contact Field-Effect Transistor>
—Formation of Source/Drain Electrode—
A Cr/Au film was formed on a substrate using a vacuum vapor deposition method.

Photolithography and etching were performed to form a source/drain electrode having a predetermined shape.

—Formation of Oxide-Semiconductor-Layer Precursor—
An oxide-semiconductor-layer precursor was formed on the substrate and the source/drain electrode. Specifically, the oxide-semiconductor-layer precursor was formed in the following manner.

3.55 g of indium nitrate ($In(NO_3)_3.3H_2O$) and 0.139 g of strontium chloride ($SrCl_2.6H_2O$) were weighed. 20 mL of 1,2-propanediol and 20 mL of ethylene glycol monomethyl ether were added thereto, followed by mixing and dissolving at room temperature, to form an oxide-semiconductor-layer-precursor-forming coating liquid. The oxide-semiconductor-layer-precursor-forming coating liquid was coated on the source/drain electrode and the substrate in a predetermined pattern using an inkjet device. The substrate was heated for 10 minutes on a hot plate heated to 120° C., to form an oxide-semiconductor-layer precursor.

Note that, the oxide-semiconductor-layer precursor obtained in this step does not function as an active layer.

—Formation of Gate-Insulating-Layer Precursor—
Next, a gate-insulating-layer precursor was formed. Specifically, the gate-insulating-layer precursor was formed in the following manner.

In 1.2 mL of cyclohexylbenzene, 1.95 mL of a toluene solution of lanthanum 2-ethylhexanoate (La content: 7% by mass, Wako 122-03371, available from Wako Chemical, Ltd.), 0.57 mL of a toluene solution of strontium 2-ethylhexanoate (Sr content: 2% by mass, Wako 195-09561, available from Wako Chemical, Ltd.), and 0.09 mL of a mineral spirit solution of zirconium oxide 2-ethylhexanoate (Zr content: 12% by mass, Wako 269-01116, available from Wako Chemical, Ltd.) were mixed, to obtain a gate-insulating-layer-precursor-forming coating liquid. The gate-insulating-layer-precursor-forming coating liquid was dropped and spin-coated on the substrate under predetermined conditions. The substrate was heated in an oven at 120° C. for 1 hour, to form a gate-insulating-layer precursor.

Note that, the gate-insulating-layer precursor obtained in this step does not function as a gate insulating layer.

—Heating Step—
Next, the substrate was heated in an oven at 400° C. for 3 hours, to form an oxide semiconductor layer and a gate insulating layer. That is, the oxide-semiconductor-layer precursor was converted to the oxide semiconductor layer, and the gate-insulating-layer precursor was converted to the gate insulating layer.

—Formation of Gate Electrode—
An Au film was formed on the gate insulating layer using a vacuum vapor deposition method.

Photolithography and etching were performed to form a gate electrode having a predetermined shape.

Through the above procedure, a top gate/bottom contact field-effect transistor was produced.

Figure 7:
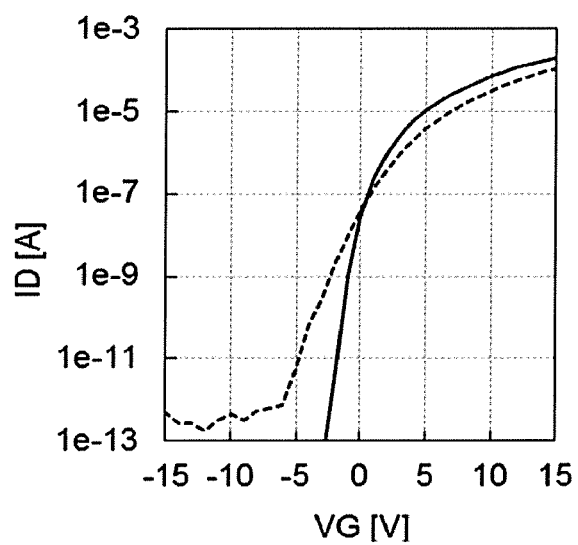
FIG. 7 is a graph representing current-voltage characteristics of field-effect transistors of Example 1 and Comparative Example 1.

<Evaluation of Transistor Performances>
A semiconductor parameter analyzer device (semiconductor parameter analyzer B1500A, available from Agilent Technologies, Inc.) was used to evaluate the obtained field-effect transistor for transistor performances. Current-voltage characteristics (transfer characteristics) were evaluated by changing gate voltage Vg from −15 V to +15 V with source/drain voltage Vds being 10 V. FIG. 7 (solid line) presents the measured current-voltage characteristics (transfer characteristics). SS value was calculated as 0.4 V.

Note in FIG. 7 that, "e" denotes the exponent of 10. Specifically, "e-3" is "0.001".

Comparative Example 1

A field-effect transistor was produced in the same manner as in Example 1, except that the heating step in Example 1 was performed after formation of an oxide-semiconductor-layer precursor to convert the oxide-semiconductor-layer precursor to an oxide semiconductor layer and the heating step in Example 1 was performed after formation of a gate-insulating-layer precursor to convert the gate-insulating-layer precursor to a gate insulating layer. Specifically, after the formation of the oxide-semiconductor-layer precursor, the substrate was heated in an oven at 400° C. for 3 hours, to form the oxide semiconductor layer. Next, after the formation of the gate-insulating-layer precursor, the substrate was heated in an oven at 400° C. for 3 hours, to form the gate insulating layer.

The obtained field-effect transistor was evaluated for transistor performances in the same manner as in Example 1. FIG. 7 (dashed line) presents the measured current-voltage characteristics (transfer characteristics). SS value was calculated as 0.85 V.

<Effects of the Invention>

A production method of Example 1 can achieve a simplified production process by performing a high-temperature heating step at one time necessary for forming oxide films constituting an oxide semiconductor layer and a gate insulating layer.

Furthermore, conceivably, performing a baking step after the lamination of the oxide semiconductor layer and the gate insulating layer makes it possible to form interfaces having less defect density in the front channel region, and thus to produce a transistor excellent in SS characteristics.

In Comparative Example 1, meanwhile, in the process of converting the oxide-semiconductor-layer precursor to the oxide semiconductor layer, the oxide semiconductor layer surface becomes a surface in contact with the air. Thus, conceivably, diffusion and aggregation of particles and atoms on the surface occur in the heating step, resulting in an increase in defect density of the oxide semiconductor layer surface. Such defects are conceived to induce charge trapping, resulting in degraded SS characteristics.

In Comparative Example 1, the surfaces of the oxide-semiconductor-layer precursor and the converted oxide semiconductor layer are free surfaces. The free surface is in a state where there is no constraint by atoms at one side, and thus movement of atoms (i.e., diffusion) easily occurs. In the process that the precursor is converted to the semiconductor, movement of atoms tends to occur by receiving influences inside and outside the layer. As a result, this may cause local inhomogeneity of the elements constituting the semiconductor, and a state where the surface of the oxide semiconductor layer is not smooth and is structurally irregular. Also, when crystallization occurs in the process of converting the precursor to the semiconductor, more free surfaces may cause excessive enlargement of crystal grains. As a result, this may cause formation of a trapping level for charges moving the grain boundaries, and increase of energy barrier for movement of charges. The above-described structural inhomogeneity of the semiconductor layer may inhibit flow of charges in the semiconductor layer to degrade electrical characteristics of the semiconductor. In Example 1, in the process that the oxide-semiconductor-layer precursor is converted to the oxide semiconductor layer, the oxide-semiconductor-layer precursor and the converted oxide semiconductor layer do not have free surfaces. Thus, conceivably, it is easy for the oxide semiconductor layer surface (front channel region) to be homogeneously formed, which makes it possible to form a semiconductor layer having excellent electrical characteristics.

Example 2

<Production of Bottom Gate/Top Contact Field-Effect Transistor>

—Formation of Gate Electrode—

A Cr/Au film was formed on a substrate using a vacuum vapor deposition method.

Photolithography and etching were performed to form a gate electrode having a predetermined shape.

—Formation of Gate-Insulating-Layer Precursor—

Next, a gate-insulating-layer precursor was formed. Specifically, the gate-insulating-layer precursor was formed in the following manner.

In 1.2 mL of cyclohexylbenzene, 1.95 mL of a toluene solution of lanthanum 2-ethylhexanoate (La content: 7% by mass, Wako 122-03371, available from Wako Chemical, Ltd.), 0.57 mL of a toluene solution of strontium 2-ethylhexanoate (Sr content: 2% by mass, Wako 195-09561, available from Wako Chemical, Ltd.), and 0.09 mL of a mineral spirit solution of zirconium oxide 2-ethylhexanoate (Zr content: 12% by mass, Wako 269-01116, available from Wako Chemical, Ltd.) were mixed, to obtain a gate-insulating-layer-precursor-forming coating liquid. The gate-insulating-layer-precursor-forming coating liquid was dropped and spin-coated on the substrate under predetermined conditions. The substrate was heated in an oven at 120° C. for 1 hour, to form a gate-insulating-layer precursor.

Note that, the gate-insulating-layer precursor obtained in this step does not function as a gate insulating layer.

—Formation of Oxide-Semiconductor-Layer Precursor—

An oxide-semiconductor-layer precursor was formed on the gate-insulating-layer precursor. Specifically, the oxide-semiconductor-layer precursor was formed in the following manner.

3.55 g of indium nitrate ($In(NO_3)_3.3H_2O$) and 0.139 g of strontium chloride ($SrCl_2.6H_2O$) were weighed. 20 mL of 1,2-propanediol and 20 mL of ethylene glycol monomethyl ether were added thereto, followed by mixing and dissolving at room temperature, to form an oxide-semiconductor-layer-precursor-forming coating liquid. The oxide-semiconductor-layer-precursor-forming coating liquid was coated on the gate-insulating-layer precursor in a predetermined pattern using an inkjet device. The substrate was heated for 10 minutes on a hot plate heated to 120° C., to form an oxide-semiconductor-layer precursor.

Note that, the oxide-semiconductor-layer precursor obtained in this step does not function as an active layer.

—Heating Step—

Next, the substrate was heated in an oven at 400° C. for 3 hours, to form an oxide semiconductor layer and a gate insulating layer. That is, the oxide-semiconductor-layer precursor was converted to the oxide semiconductor layer, and the gate-insulating-layer precursor was converted to the gate insulating layer.

—Formation of Source/Drain Electrode—

An Au film was formed on the substrate using a metal mask and a vacuum vapor deposition method, to form a source/drain electrode.

Through the above procedure, a bottom gate/top contact field-effect transistor was produced.

<Evaluation of Transistor Characteristics>

The obtained field-effect transistor was evaluated for transistor performances in the same manner as in Example 1. SS value was calculated as 0.43 V from the measured current-voltage characteristics (transfer characteristics).

Comparative Example 2

A field-effect transistor was produced in the same manner as in Example 2, except that the heating step in Example 2 was performed after formation of a gate-insulating-layer precursor to convert the gate-insulating-layer precursor to a gate insulating layer and the heating step in Example 2 was performed after formation of an oxide-semiconductor-layer precursor to convert the oxide-semiconductor-layer precursor to an oxide semiconductor layer. Specifically, after the formation of the gate-insulating-layer precursor, the substrate was heated in an oven at 400° C. for 3 hours, to form the gate insulating layer. Next, after the formation of the oxide-semiconductor-layer precursor, the substrate was heated in an oven at 400° C. for 3 hours, to form the oxide semiconductor layer.

The obtained field-effect transistor was evaluated for transistor performances in the same manner as in Example 2. The measured current-voltage characteristics (transfer characteristics) are presented. SS value was calculated as 0.82 V.

<Effects of the Invention>

A production method of Example 2 can achieve a simplified production process by performing a high-temperature heating step at one time necessary for forming oxide films constituting a semiconductor layer and a gate insulating layer.

Furthermore, conceivably, performing a baking step after the lamination of the semiconductor layer and the gate insulating layer makes it possible to form interfaces having less defect density in the front channel region, and thus to produce a transistor excellent in SS characteristics.

In Comparative Example 2, meanwhile, in the process of converting the gate-insulating-layer precursor to the gate insulating layer, the gate insulating layer becomes a surface in contact with the air. Thus, conceivably, diffusion and aggregation of particles and atoms on the surface occur in the heating step, resulting in an increase in surface roughness of the gate insulating layer. Formation of the oxide semiconductor layer on such an inhomogeneous gate insulating layer is conceived to increase defect density of the front channel, resulting in degraded SS characteristics.

Example 3

<Production of Bottom Gate/Bottom Contact Field-Effect Transistor>
—Formation of Gate Electrode—
An Au film was formed on a substrate using a vacuum vapor deposition method.
Photolithography and etching were performed to form a gate electrode having a predetermined shape.
—Formation of Gate Insulating Layer—
Next, a $SiO_2$ film was formed by plasma CVD so as to have a thickness of 200 nm, to form a gate insulating layer.
—Formation of Source/Drain Electrode—
An ITO film was formed on the gate insulating layer using a sputtering method.
Photolithography and etching were performed to form a source/drain electrode having a predetermined shape.
—Formation of Oxide-Semiconductor-Layer Precursor—
An oxide-semiconductor-layer precursor was formed on the substrate and the source/drain electrode. Specifically, the oxide-semiconductor-layer precursor was formed in the following manner.
3.55 g of indium nitrate ($In(NO_3)_3 \cdot 3H_2O$) and 0.139 g of strontium chloride ($SrCl_2 \cdot 6H_2O$) were weighed. 20 mL of 1,2-propanediol and 20 mL of ethylene glycol monomethyl ether were added thereto, followed by mixing and dissolving at room temperature, to form an oxide-semiconductor-layer-precursor-forming coating liquid. The oxide-semiconductor-layer-precursor-forming coating liquid was coated on the source/drain electrode and the substrate in a predetermined pattern using an inkjet device. The substrate was heated for 10 minutes on a hot plate heated to 120° C., to form an oxide-semiconductor-layer precursor.

Note that, the oxide-semiconductor-layer precursor obtained in this step does not function as an active layer.
—Formation of Passivation Layer Precursor—
Next, a passivation layer precursor was formed. Specifically, the passivation layer precursor was formed in the following manner.

In 1 mL of toluene, 0.99 mL of a toluene solution of lanthanum 2-ethylhexanoate (La content: 7% by mass, Wako 122-03371, available from Wako Chemical, Ltd.) and 0.27 mL of a toluene solution of strontium 2-ethylhexanoate (Sr content: 2% by mass, Wako 195-09561, available from Wako Chemical, Ltd.) were mixed, to obtain a passivation-layer-precursor-forming coating liquid. The passivation-layer-precursor-forming coating liquid was dropped and spin-coated on the substrate under predetermined conditions. The substrate was heated in an oven at 120° C. for 1 hour, to form a passivation layer precursor.

Note that, the passivation layer precursor obtained in this step does not function as a passivation layer.
—Heating Step—
Next, the substrate was heated in an oven at 400° C. for 3 hours, to form an oxide semiconductor layer and a passivation layer. That is, the oxide-semiconductor-layer precursor was converted to the oxide semiconductor layer, and the passivation layer precursor was converted to the passivation layer.

Through the above procedure, a bottom gate/bottom contact field-effect transistor was produced.
<Evaluation of Transistor Characteristics>
The obtained field-effect transistor was evaluated for transistor performances in the same manner as in Example 1. SS value was calculated as 0.41 V from the measured current-voltage characteristics (transfer characteristics).

Comparative Example 3

A field-effect transistor was produced in the same manner as in Example 3, except that the heating step in Example 3 was performed after formation of an oxide-semiconductor-layer precursor to convert the oxide-semiconductor-layer precursor to an oxide semiconductor layer and the heating step in Example 3 was performed after formation of a passivation layer precursor to convert the passivation layer precursor to a passivation layer. Specifically, after the formation of the oxide-semiconductor-layer precursor, the substrate was heated in an oven at 400° C. for 3 hours, to form the oxide semiconductor layer. Next, after the formation of the passivation layer precursor, the substrate was heated in an oven at 400° C. for 3 hours, to form the passivation layer.

The obtained field-effect transistor was evaluated for transistor performances in the same manner as in Example 3. SS value was calculated as 0.78 V from the measured current-voltage characteristics (transfer characteristics).
<Effects of the Invention>
A production method of Example 3 can achieve a simplified production process by performing a high-temperature heating step at one time necessary for forming oxide films constituting a semiconductor layer and a passivation layer.

Furthermore, conceivably, performing a baking step after the lamination of the semiconductor layer and the passivation layer makes it possible to form interfaces having less defect density in the back channel interfaces, and thus to produce a transistor excellent in SS characteristics.

In Comparative Example 3, meanwhile, in the process of converting the oxide-semiconductor-layer precursor to the oxide semiconductor layer, the oxide semiconductor layer surface becomes a surface in contact with the air. Thus, conceivably, diffusion and aggregation of particles and atoms on the surface occur in the heating step, resulting in an increase in defect density of the oxide semiconductor layer surface. Such defects are conceived to induce charge trapping, resulting in degraded SS characteristics.

Example 4

<Production of Bottom Gate/Top Contact Field-Effect Transistor>
—Formation of Gate Electrode—
A Cr/Au film was formed on a substrate using a vacuum vapor deposition method.
Photolithography and etching were performed to form a gate electrode having a predetermined shape.
—Formation of Gate Insulating Layer—
Next, a $SiO_2$ film was formed by plasma CVD so as to have a thickness of 200 nm, to form a gate insulating layer.
—Formation of Oxide-Semiconductor-Layer Precursor—
An oxide-semiconductor-layer precursor was formed on the gate insulating layer. Specifically, the oxide-semiconductor-layer precursor was formed in the following manner.
3.55 g of indium nitrate $(In(NO_3)_3.3H_2O)$ and 0.139 g of strontium chloride $(SrCl_2.6H_2O)$ were weighed. 20 mL of 1,2-propanediol and 20 mL of ethylene glycol monomethyl ether were added thereto, followed by mixing and dissolving at room temperature, to form an oxide-precursor-forming coating liquid. The oxide-precursor-forming coating liquid was coated on the gate insulating layer in a predetermined pattern using an inkjet device. The substrate was heated for 10 minutes on a hot plate heated to 120° C., to form an oxide-semiconductor-layer precursor. Note that, the oxide-semiconductor-layer precursor obtained in this step does not function as an active layer.
—Formation of Passivation Layer Precursor—
Next, a passivation layer precursor was formed. Specifically, the passivation layer precursor was formed in the following manner.
In 1 mL of toluene, 0.99 mL of a toluene solution of lanthanum 2-ethylhexanoate (La content: 7% by mass, Wako 122-03371, available from Wako Chemical, Ltd.) and 0.27 mL of a toluene solution of strontium 2-ethylhexanoate (Sr content: 2% by mass, Wako 195-09561, available from Wako Chemical, Ltd.) were mixed, to obtain a passivation-layer-precursor-forming coating liquid. The passivation-layer-precursor-forming coating liquid was dropped and spin-coated on the substrate under predetermined conditions. The substrate was heated in an oven at 120° C. for 1 hour, to form a passivation layer precursor. Note that, the passivation layer precursor obtained in this step does not function as a passivation layer.
—Heating Step—
Next, the substrate was heated in an oven at 400° C. for 3 hours, to form an oxide semiconductor layer and a passivation layer. That is, the oxide-semiconductor-layer precursor was converted to the oxide semiconductor layer, and the passivation layer precursor was converted to the passivation layer.
Next, photolithography and etching were performed to pattern the passivation layer in a predetermined shape.

—Formation of Source/Drain Electrode—
An Au film was formed on the passivation layer and the oxide semiconductor layer using a vacuum vapor deposition method.
Next, photolithography and etching were performed to form a source/drain electrode into a predetermined shape.
Through the above procedure, a bottom gate/top contact field-effect transistor was produced (FIG. 5H).

Example 5

<Production of Top Gate/Top Contact Field-Effect Transistor>
—Formation of Oxide-Semiconductor-Layer Precursor—
An oxide-semiconductor-layer precursor was formed on a substrate. Specifically, the oxide-semiconductor-layer precursor was formed in the following manner.
3.55 g of indium nitrate $(In(NO_3)_3.3H_2O)$ and 0.139 g of strontium chloride $(SrCl_2.6H_2O)$ were weighed. 20 mL of 1,2-propanediol and 20 mL of ethylene glycol monomethyl ether were added thereto, followed by mixing and dissolving at room temperature, to form an oxide-precursor-forming coating liquid. The oxide-precursor-forming coating liquid was coated on the substrate in a predetermined pattern using an inkjet device. The substrate was heated for 10 minutes on a hot plate heated to 120° C., to form an oxide-semiconductor-layer precursor. Note that, the oxide-semiconductor-layer precursor obtained in this step does not function as an active layer.
—Formation of Gate-Insulating-Layer Precursor—
Next, a gate-insulating-layer precursor was formed. Specifically, the gate-insulating-layer precursor was formed in the following manner.
In 1.2 mL of cyclohexylbenzene, 1.95 mL of a toluene solution of lanthanum 2-ethylhexanoate (La content: 7% by mass, Wako 122-03371, available from Wako Chemical, Ltd.), 0.57 mL of a toluene solution of strontium 2-ethylhexanoate (Sr content: 2% by mass, Wako 195-09561, available from Wako Chemical, Ltd.), and 0.09 mL of a mineral spirit solution of zirconium oxide 2-ethylhexanoate (Zr content: 12% by mass, Wako 269-01116, available from Wako Chemical, Ltd.) were mixed, to obtain a gate-insulating-layer-precursor-forming coating liquid. The gate-insulating-layer-precursor-forming coating liquid was dropped and spin-coated on the oxide-semiconductor-layer precursor under predetermined conditions. The substrate was heated in an oven at 120° C. for 1 hour, to form a gate-insulating-layer precursor.
Note that, the gate-insulating-layer precursor obtained in this step does not function as a gate insulating layer.
—Heating Step—
Next, the substrate was heated in an oven at 400° C. for 3 hours, to form an oxide semiconductor layer and a gate insulating layer. That is, the oxide-semiconductor-layer precursor was converted to the oxide semiconductor layer, and the gate-insulating-layer precursor was converted to the gate insulating layer.
—Formation of Gate Electrode—
An Al film was formed on the gate insulating layer using DC sputtering. Next, photolithography and etching were performed to form a gate electrode having a predetermined shape. The gate insulating layer in a region where the gate electrode had not been formed was removed by etching, to pattern the gate insulating layer.
—Formation of Interlayer Insulating Layer—
Next, a $SiO_2$ film was formed by plasma CVD so as to have a thickness of 300 nm. Photolithography and etching were performed to remove $SiO_2$ in a region where the resist pattern had not been formed, to form an interlayer insulating layer.

—Formation of Source/Drain Electrode—

An Al film was formed on the substrate using DC sputtering.

Photolithography and etching were performed to form a source/drain electrode having a predetermined shape.

Figure 6F:
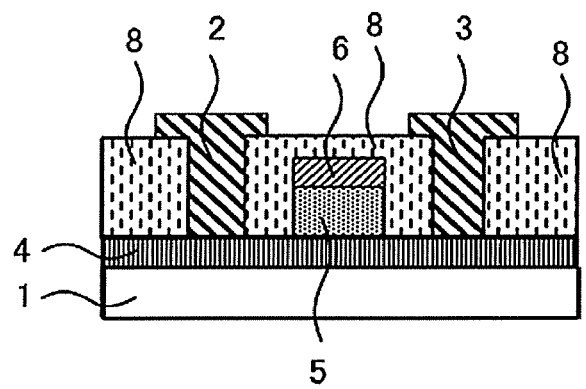
FIG. 6F is a schematic view illustrating yet another example of a method for producing a field-effect transistor (part 6)

Through the above procedure, a top gate/top contact field-effect transistor was produced (FIG. 6F).

Aspects of the present disclosure are, for example, as follows.

<1> A method for producing a field-effect transistor including a first oxide layer and a second oxide layer and forming a front channel or a back channel in a region where the first oxide layer and the second oxide layer are adjacent to each other, the method including:

forming a second precursor layer, which is a precursor of the second oxide layer, so as to be in contact with a first precursor layer, which is a precursor of the first oxide layer, and then converting the first precursor layer and the second precursor layer to the first oxide layer and the second oxide layer, respectively, the forming includes at least one of treatments (I) and (II) below:

(I) a treatment of: coating a first-oxide-precursor-forming coating liquid that can form a precursor of a first oxide and contains a solvent; and then removing the solvent to form the first precursor layer which is the precursor of the first oxide layer; and (II) a treatment of: coating a second-oxide-precursor-forming coating liquid that can form a precursor of a second oxide and contains a solvent; and then removing the solvent to form the second precursor layer which is the precursor of the second oxide layer.

<2> The method for producing a field-effect transistor according to <1>, wherein the first oxide layer includes an oxide insulating layer and the second oxide layer includes an oxide semiconductor layer.

<3> The method for producing a field-effect transistor according to <2>, wherein the oxide insulating layer includes a gate insulating layer.

<4> The method for producing a field-effect transistor according to <1>, wherein the first oxide layer includes an oxide semiconductor layer and the second oxide layer includes an oxide insulating layer.

<5> The method for producing a field-effect transistor according to <4>, wherein the oxide insulating layer includes a gate insulating layer.

<6> The method for producing a field-effect transistor according to <4>, wherein the oxide insulating layer includes a passivation layer.

<7> The method for producing a field-effect transistor according to any one of <1> to <6>, wherein the converting the first precursor layer and the second precursor layer to the first oxide layer and the second oxide layer, respectively is performed by heating.

The present disclosure can solve the above existing problems and can provide a method for producing a field-effect transistor, where when a coating method is used for formation of a front channel or a back channel, the method can homogeneously form a front channel interface and a back channel interface to reduce defect density, making it possible to better transistor characteristics.

What is claimed is:

1. A method for producing a field-effect transistor including a first oxide layer and a second oxide layer and forming a front channel or a back channel in a region where the first oxide layer and the second oxide layer are adjacent to each other, the method comprising:

forming a second precursor layer, which is a precursor of the second oxide layer, so as to be in contact with a first precursor layer, which is a precursor of the first oxide layer; and converting the first precursor layer and the second precursor layer at a same time to the first oxide layer and the second oxide layer, respectively, by heating in an oven at a temperature between 200° C. and 600° C.

the forming includes at least one of treatments (I) and (II) below:

(I) a treatment of: coating a first-oxide-precursor-forming coating liquid that can form a precursor of a first oxide and contains a solvent; and then removing the solvent to form the first precursor layer which is the precursor of the first oxide layer; and (II) a treatment of: coating a second-oxide-precursor-forming coating liquid that can form a precursor of a second oxide and contains a solvent; and then removing the solvent to form the second precursor layer which is the precursor of the second oxide layer, wherein during the converting the first precursor layer and the second precursor layer to the first oxide layer and the second oxide layer, one of the first oxide layer and the second oxide layer is free of contact with air so as not to have a free surface.

2. The method for producing a field-effect transistor according to claim 1, wherein the first oxide layer includes an oxide insulating layer and the second oxide layer includes an oxide semiconductor layer.

3. The method for producing a field-effect transistor according to claim 2, wherein the oxide insulating layer includes a gate insulating layer.

4. The method for producing a field-effect transistor according to claim 1, wherein the first oxide layer includes an oxide semiconductor layer and the second oxide layer includes an oxide insulating layer.

5. The method for producing a field-effect transistor according to claim 4, wherein the oxide insulating layer includes a gate insulating layer.

6. The method for producing a field-effect transistor according to claim 4, wherein the oxide insulating layer includes a passivation layer.

* * * * *